US007760766B2

(12) United States Patent
Takahashi et al.

(10) Patent No.: US 7,760,766 B2
(45) Date of Patent: Jul. 20, 2010

(54) AUDIO PROCESSOR

(75) Inventors: Satoshi Takahashi, Osaka (JP); Shuji Kato, Osaka (JP)

(73) Assignee: Panasonic Corporation, Osaka (JP)

(*) Notice: Subject to any disclaimer, the term of this patent is extended or adjusted under 35 U.S.C. 154(b) by 816 days.

(21) Appl. No.: 11/407,084

(22) Filed: Apr. 20, 2006

(65) Prior Publication Data

US 2007/0005163 A1 Jan. 4, 2007

(30) Foreign Application Priority Data

Jul. 4, 2005 (JP) ............................ 2005-194984

(51) Int. Cl.
*H04J 3/06* (2006.01)
*H03D 3/18* (2006.01)
*H03D 3/24* (2006.01)

(52) U.S. Cl. ........................ 370/503; 375/327; 375/376

(58) Field of Classification Search .................. 700/90, 700/94, 235, 705, 708
See application file for complete search history.

(56) References Cited

U.S. PATENT DOCUMENTS 4,030,045 A * 6/1977 Clark ......................... 331/1 A
4,423,520 A * 12/1983 Murayama et al. .......... 375/342
4,495,474 A * 1/1985 Nishikawa et al. ............ 331/11
4,692,803 A * 9/1987 Tobita ........................ 348/484
4,698,678 A * 10/1987 Collins ....................... 348/518
4,780,759 A * 10/1988 Matsushima et al. ........ 348/537
5,079,525 A * 1/1992 Ishikawa et al. ............ 332/120
5,216,717 A * 6/1993 Bourcet et al. ................. 381/3
5,228,035 A * 7/1993 Hirato et al. ................ 370/446
5,517,685 A * 5/1996 Aoyama et al. ............. 455/260
5,751,509 A * 5/1998 Ogasawara et al. ........... 360/70
5,903,197 A * 5/1999 Kikugawa .................... 331/17
6,081,492 A * 6/2000 Asai et al. ................ 369/59.14
6,151,076 A * 11/2000 Hoffman et al. ............ 348/512
6,636,727 B2 * 10/2003 Muschallik et al. ......... 455/260
6,894,571 B2 * 5/2005 Sumi et al. .................... 331/25
6,914,637 B1 * 7/2005 Wolf et al. .................. 348/473

(Continued)

FOREIGN PATENT DOCUMENTS

JP 05-090958 4/1993

(Continued)

OTHER PUBLICATIONS

Japanese Notice of Reasons for Rejection, w/ English translation thereof, issued in Japanese Patent Application No. JP 2005-194984 dated Nov. 24, 2009.

*Primary Examiner*—Kevin C Harper
(74) *Attorney, Agent, or Firm*—McDermott Will & Emery LLP

(57) ABSTRACT

An audio information detector extracts frequency information on audio data from a packet called an ASP in the HDMI standard and outputs the extracted frequency information to a frequency divider as audio information. The frequency divider determines a frequency division ratio based on the audio information, divides the frequency of a PLL clock signal output from an analog PLL circuit by the frequency division ratio and outputs the resultant signal as a comparison clock signal. The analog PLL circuit performs feedback control such that the comparison clock signal and a reference clock signal are synchronized with each other, and generates an audio clock signal obtained by performing frequency multiplication or division on the reference clock signal.

8 Claims, 5 Drawing Sheets

U.S. PATENT DOCUMENTS

| | | | | |
|---|---|---|---|---|
| 6,952,461 | B2 * | 10/2005 | Yasuda et al. | 375/372 |
| 7,084,712 | B2 * | 8/2006 | Fujiwara | 331/51 |
| 7,109,803 | B2 * | 9/2006 | Rebel | 331/2 |
| 7,180,377 | B1 * | 2/2007 | Leong et al. | 331/17 |
| 7,312,642 | B1 * | 12/2007 | Li et al. | 327/105 |
| 7,474,358 | B2 * | 1/2009 | Miyamoto | 348/723 |
| 2002/0122515 | A1 * | 9/2002 | Bodenschatz | 375/354 |
| 2003/0003888 | A1 | 1/2003 | Moehlmann | |
| 2003/0063701 | A1 * | 4/2003 | Eubanks | 375/376 |
| 2003/0229815 | A1 * | 12/2003 | Fujiwara et al. | 713/500 |
| 2004/0070663 | A1 * | 4/2004 | Niito | 347/236 |
| 2004/0252713 | A1 * | 12/2004 | Taylor et al. | 370/437 |
| 2005/0058158 | A1 | 3/2005 | Miyamoto | |
| 2005/0216780 | A1 * | 9/2005 | Sung et al. | 713/500 |
| 2005/0277386 | A1 * | 12/2005 | Yoneu | 455/76 |
| 2006/0120243 | A1 * | 6/2006 | Kurita | 369/59.19 |

FOREIGN PATENT DOCUMENTS

| | | |
|---|---|---|
| JP | 07-105630 | 4/1995 |
| JP | 08-307365 | 11/1996 |
| JP | 10-228730 | 8/1998 |
| JP | 11-075161 | 3/1999 |
| JP | 11-341306 | 12/1999 |
| JP | 2003-115759 | 4/2003 |
| JP | 2004-248123 | 9/2004 |

* cited by examiner

AUDIO PROCESSOR

CROSS-REFERENCE TO RELATED APPLICATION

The disclosure of Japanese Patent Application No. 2005-194984 filed on Jul. 4, 2005 including specification, drawings and claims is incorporated herein by reference in its entirety.

BACKGROUND OF THE INVENTION

1. Field of the Invention

The present invention relates to an audio processor for use in reproducing audio data transmitted through a digital interface such as an IEEE1394 interface or a high-definition multimedia interface (HDMI) for DVD players, digital television sets and AV amplifiers, for example.

2. Description of the Related Art

With a digital interface such as an IEEE1394 interface or an HDMI, it is possible to select a rate (frequency) from a plurality of sampling rates to transmit audio data.

In an audio processor for use in reproducing audio data transmitted through a digital interface as described above, to reproduce audio data, an audio clock signal having the same frequency as the sampling rate of transmitted audio data is generated using a phase locked loop (PLL) circuit in many cases (see, for example, Japanese Unexamined Patent Publication No. 2004-248123).

In this PLL circuit, feedback control is performed such that a comparison clock signal obtained by dividing the frequency of an audio clock signal by a given frequency division ratio is synchronized with a reference clock signal having a frequency which is allowed to be used at a receiver, thereby generating an audio clock signal obtained by performing frequency multiplication or division on the reference clock signal.

A PLL circuit as described above is configured to change the frequency division ratio using, for example, a noise shaver and is capable of dealing with a plurality of sampling rates (see, for example, Japanese Unexamined Patent Publication No. 11-341306). In this case, the frequency division ratio needs to be previously determined. In the case of a digital interface in the HDMI, for example, this frequency division ratio is considered to be determined by obtaining a sampling frequency FS from an equation: $128 \times FS = (CTS \times \text{Pixel Clock})/N$, using N information and CTS included in a packet called clock regeneration packet (CRP) when audio data is transmitted.

However, the determination of a frequency division ratio using such an equation tends to cause the problem of increase in circuit scale of an audio processor in a configuration in which a section for determining the frequency division ratio is formed by hardware. In addition, operation time is needed, so that there arises another problem in which the lock time of audio data increases.

SUMMARY OF THE INVENTION

It is therefore an object of the present invention to generate, in a short lock time, various audio clock signals for reproducing audio data without increase in circuit scale in an audio processor for reproducing audio data transmitted through a digital interface.

In order to achieve this object, according to the present invention, an audio processor for reproducing audio data transmitted through a digital interface includes: a sampling frequency information detector for detecting sampling frequency information indicating a sampling frequency of the audio data from the audio data; a comparison clock frequency divider for obtaining a frequency division ratio according to the sampling frequency information and outputting a comparison clock signal obtained by dividing the frequency of an input PLL clock signal by the frequency division ratio; an analog PLL circuit for outputting the PLL clock signal having a phase according to a phase difference between an input reference clock signal and the comparison clock signal; and an audio clock frequency divider for outputting an audio clock signal obtained by dividing the frequency of the PLL clock signal.

With this configuration, a frequency division ratio for generating an audio clock signal is easily determined without increase in circuit scale.

In another aspect of the present invention, an audio processor for reproducing audio data transmitted through a digital interface includes: a sampling frequency information detector for detecting sampling frequency information indicating a sampling frequency of the audio data from the audio data; a comparison clock frequency divider for obtaining a frequency division ratio according to the sampling frequency information and outputting a comparison clock signal obtained by dividing the frequency of an input PLL clock signal by the frequency division ratio; a digital PLL circuit for outputting a pre-PLL clock signal having a phase according to a phase difference between an input reference clock signal and the comparison clock signal; an analog PLL circuit for changing a phase of the PLL clock signal based on the pre-PLL clock signal and outputting a resultant signal; and an audio clock frequency divider for outputting an audio clock signal obtained by dividing the frequency of the PLL clock signal.

With this configuration, it is possible to reduce the lock time for the PLL circuit.

In another aspect of the present invention, an audio processor for reproducing audio data transmitted through a digital interface includes: a sampling frequency information detector for detecting sampling frequency information indicating a sampling frequency of the audio data from the audio data; a comparison clock frequency divider for outputting a comparison clock signal obtained by dividing the frequency of an input PLL clock signal; a frequency-division-ratio setting section for obtaining a frequency division ratio according to the sampling frequency information and setting the obtained frequency division ratio in the comparison clock frequency divider; a digital PLL circuit for outputting a pre-PLL clock signal having a phase according to a phase difference between an input reference clock signal and the comparison clock signal; an analog PLL circuit for changing a phase of the PLL clock signal based on the pre-PLL clock signal; and an audio clock frequency divider for outputting an audio clock signal obtained by dividing the frequency of the PLL clock signal.

With this configuration, it is also possible to make the frequency-division-ratio setting section set a frequency division ratio for a comparison clock frequency divider to allow operation of an audio processor, for example, to be controlled using software.

In another aspect of the present invention, an audio processor for reproducing audio data transmitted through a digital interface includes: a sample rate information detector for detecting sample rate information indicating a sampling frequency of the audio data from the audio data; a frequency ratio information detector for detecting, from the audio data, frequency ratio information indicating a ratio between the frequency of a transmission clock signal for use in transmission of the audio data and the sampling frequency; a first comparison clock frequency divider for outputting a first comparison clock signal obtained by dividing the frequency of an input PLL clock signal; a second comparison clock frequency divider for outputting a second comparison clock signal obtained by dividing the frequency of the first comparison clock signal; a reference clock signal frequency divider for outputting a frequency division reference clock signal obtained by dividing the frequency of an input reference clock signal; a frequency-division-ratio setting section for obtaining a frequency division ratio for the first comparison clock frequency divider according to the sample rate information, setting the obtained frequency division ratio in the first comparison clock frequency divider, obtaining a frequency division ratio for the second comparison clock frequency divider and a frequency division ratio for the reference clock signal frequency divider according to the frequency ratio information and setting the obtained frequency division ratios in the second comparison clock frequency divider and the reference clock signal frequency divider, respectively; a digital PLL circuit for outputting a pre-PLL clock signal having a phase according to a phase difference between the frequency division reference clock signal and the second comparison clock signal; an analog PLL circuit for changing a phase of the PLL clock signal based on the pre-PLL clock signal; and an audio clock frequency divider for outputting an audio clock signal obtained by dividing the frequency of the PLL clock signal.

In another aspect of the present invention, an audio processor for reproducing audio data transmitted through a digital interface includes: a sample rate information detector for detecting sample rate information indicating a sampling frequency of the audio data from the audio data; a frequency ratio information detector for detecting, from the audio data, frequency ratio information indicating a ratio between the frequency of a transmission clock signal for use in transmission of the audio data and the sampling frequency; a first comparison clock frequency divider for obtaining a frequency division ratio according to the sample rate information and outputting a first comparison clock signal obtained by dividing the frequency of an input PLL clock signal by the obtained frequency division ratio; a second comparison clock frequency divider for obtaining a frequency division ratio according to the frequency ratio information and outputting a second comparison clock signal obtained by dividing the frequency of the first comparison clock signal by the obtained frequency division ratio; a reference clock signal frequency divider for obtaining a frequency division ratio according to the frequency ratio information and outputting a frequency division reference clock signal obtained by dividing the frequency of an input reference clock signal by the obtained frequency division ratio; a digital PLL circuit for outputting a pre-PLL clock signal having a phase according to a phase difference between the frequency division reference clock signal and the second comparison clock signal; an analog PLL circuit for changing a phase of the PLL clock signal based on the pre-PLL clock signal and outputting a resultant signal; and an audio clock frequency divider for outputting an audio clock signal obtained by dividing the frequency of the PLL clock signal.

In application of devices in the HDMI standard, for example, these audio processors output audio clock signals conforming to the HDMI standard.

In another aspect of the present invention, the digital PLL circuit is configured to change the frequency of the pre-PLL clock signal according to the sampling frequency information.

In another aspect of the present invention, the digital PLL circuit is configured to change the frequency of the pre-PLL clock signal according to the frequency ratio information.

These configurations allow the PLL circuit to be locked at higher speed.

Another aspect of the present invention, an audio processor for reproducing audio data transmitted through a digital interface includes: a sampling frequency information outputting section for detecting sampling frequency information indicating a sampling frequency of the audio data from the audio data and outputting the sampling frequency information to the outside of the audio processor; a receiver for receiving a frequency division ratio transmitted from the outside of the audio processor according to the sampling frequency information; a comparison clock frequency divider for outputting a comparison clock signal obtained by dividing the frequency of an input PLL clock signal by the frequency division ratio received by the receiver; an analog PLL circuit for outputting the PLL clock signal having a phase according to a phase difference between an input reference clock signal and the comparison clock signal; and an audio clock frequency divider for outputting an audio clock signal obtained by dividing the frequency of the PLL clock signal.

With this configuration, an audio clock signal is generated according to a frequency division ratio obtained at, and transmitted from, the outside of the audio processor.

In another aspect of the present invention, the digital interface is a digital interface in an HDMI (high-definition multimedia interface) standard, and the sampling frequency information is information indicated by channel status bits in the HDMI standard.

In another aspect of the present invention, the digital interface is a digital interface in an HDMI (high-definition multimedia interface) standard, and the frequency ratio information is an N value and a CTS value included in a CRP (clock regeneration packet) in the HDMI standard.

With these configurations, it is possible to generate various audio clock signals without increase in circuit scale in an audio processor in the HDMI standard.

DETAILED DESCRIPTION OF THE INVENTION

Hereinafter, embodiments of the present invention will be described with reference to the drawings. The following embodiments are examples of an audio processor for outputting an audio clock signal for processing (reproducing) audio data transmitted based on the high-definition multimedia interface (HDMI) standard.

Embodiment 1

Figure 1:
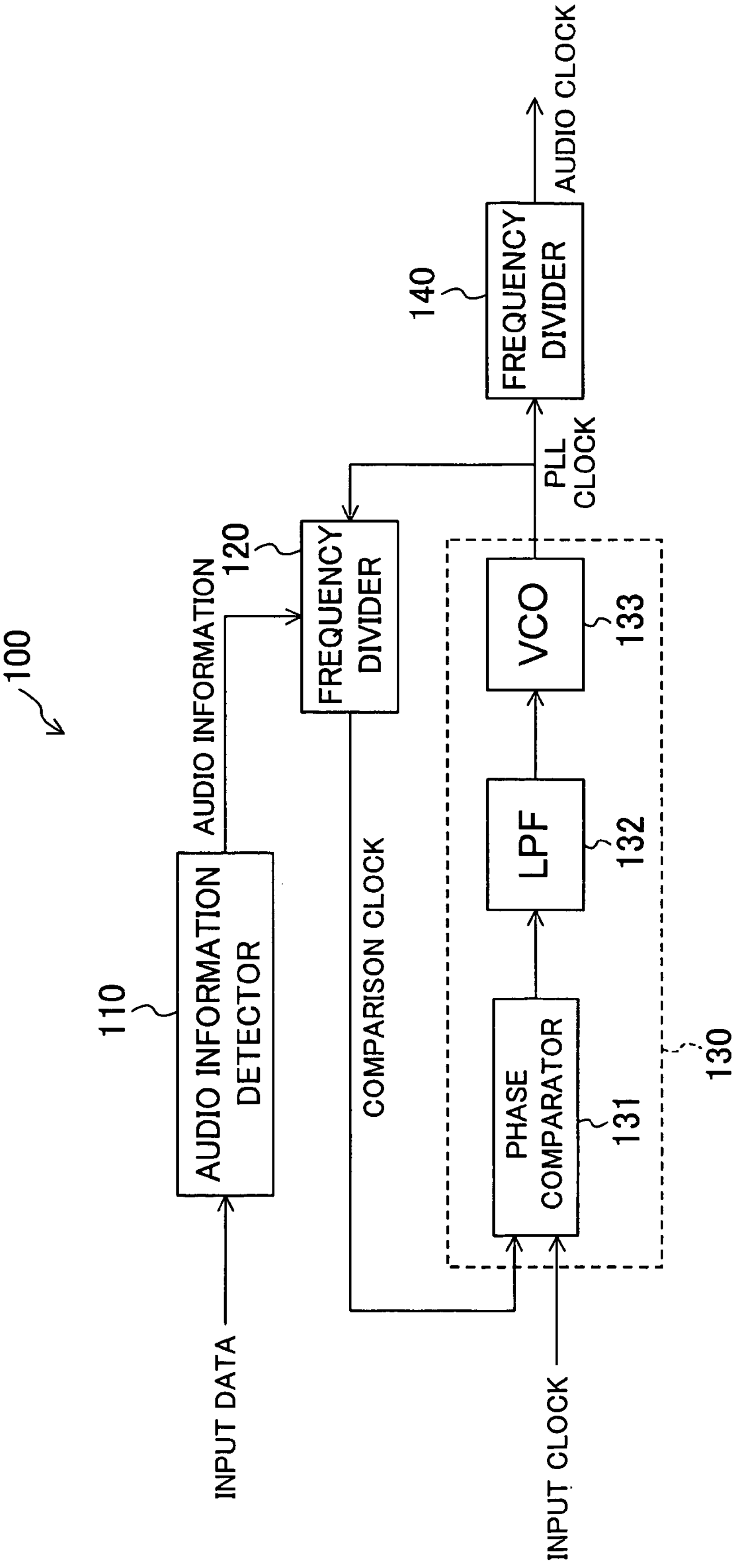
FIG. 1 is a block diagram illustrating a configuration of an audio processor according to a first embodiment of the present invention.

FIG. 1 is a block diagram illustrating a configuration of an audio processor 100 according to a first embodiment of the present invention. As illustrated in FIG. 1, the audio processor 100 includes: an audio information detector 110; a frequency divider 120; an analog PLL circuit 130; and a frequency divider 140.

The audio information detector 110 receives a packet (i.e., input data shown in FIG. 1) called an audio sample packet (ASP) in the HDMI standard. The ASP contains information called channel status bits (C bits). The C bits includes audio information such as sampling frequency information on audio data but is not conventionally used to obtain a frequency division ratio. The audio information detector 110 extracts frequency information on audio data from the C bits in the ASP and outputs the obtained information to the frequency divider 120 as audio information.

The frequency divider 120 determines a frequency division ratio based on the audio information and outputs a comparison clock signal obtained by dividing the frequency of a PLL clock signal (which will be described later) by the determined frequency division ratio. Since the sampling frequency is recognized from the audio information, for example, the frequency division ratio determined based on the audio information is determined such that the PLL clock signal is in the range of a lock frequency for the analog PLL circuit 130. For example, if the lock frequency for the analog PLL circuit 130 is in the range from 10 MHz to 20 MHz, the PLL clock signal is also in this range. That is, complicated operation necessary for conventional audio processors is not needed, so that a circuit for determining the frequency division ratio is simpler than that in a conventional audio processor.

The analog PLL circuit 130 includes: a phase comparator 131; a low pass filter (LPF) 132; and a voltage control oscillator (VCO) 133.

The phase comparator 131 outputs a signal at a voltage according to the phase difference between a received clock signal (i.e., an input clock signal) and the comparison clock signal.

The LPF 132 outputs an LPF clock signal obtained by smoothing the output of the phase comparator 131 to the VCO 133.

The VCO 133 outputs a PLL clock signal having a frequency according to the voltage of the LPF clock signal.

The foregoing configuration allows the analog PLL circuit 130 to output a PLL clock signal having a frequency obtained by multiplying the input clock signal by the frequency division ratio.

The frequency divider 140 divides the frequency of the PLL clock signal by a given frequency division ratio and outputs the resultant signal as an audio clock signal.

In the audio processor 100 with the foregoing configuration, when the ASP is input to the audio information detector 110 as input data, the audio information detector 110 extracts frequency information on channel status bits and outputs the extracted information to the frequency divider 120 as audio information. The frequency divider 120 determines a frequency division ratio based on the audio information and performs frequency division on the PLL clock signal.

In this manner, feedback control is performed in the analog PLL circuit 130 and, when the analog PLL circuit 130 is locked, a PLL clock signal having a given frequency is output. This PLL clock signal has its frequency divided by the frequency divider 140 and then is output as an audio clock signal.

In this manner, in this embodiment, a frequency division ratio is easily determined from frequency information on channel status bits, so that the time necessary for operation on the frequency division ratio is reduced and, in addition, no circuit is needed for operation on a frequency division ratio.

In addition, outputs of abnormal data and outputs of unnecessary data are stopped, thus enabling reduction of the time necessary for data output during normal operation (e.g., transmission of two channels of data to equipment which is capable of receiving only two channels of data).

Embodiment 2

Figure 2:
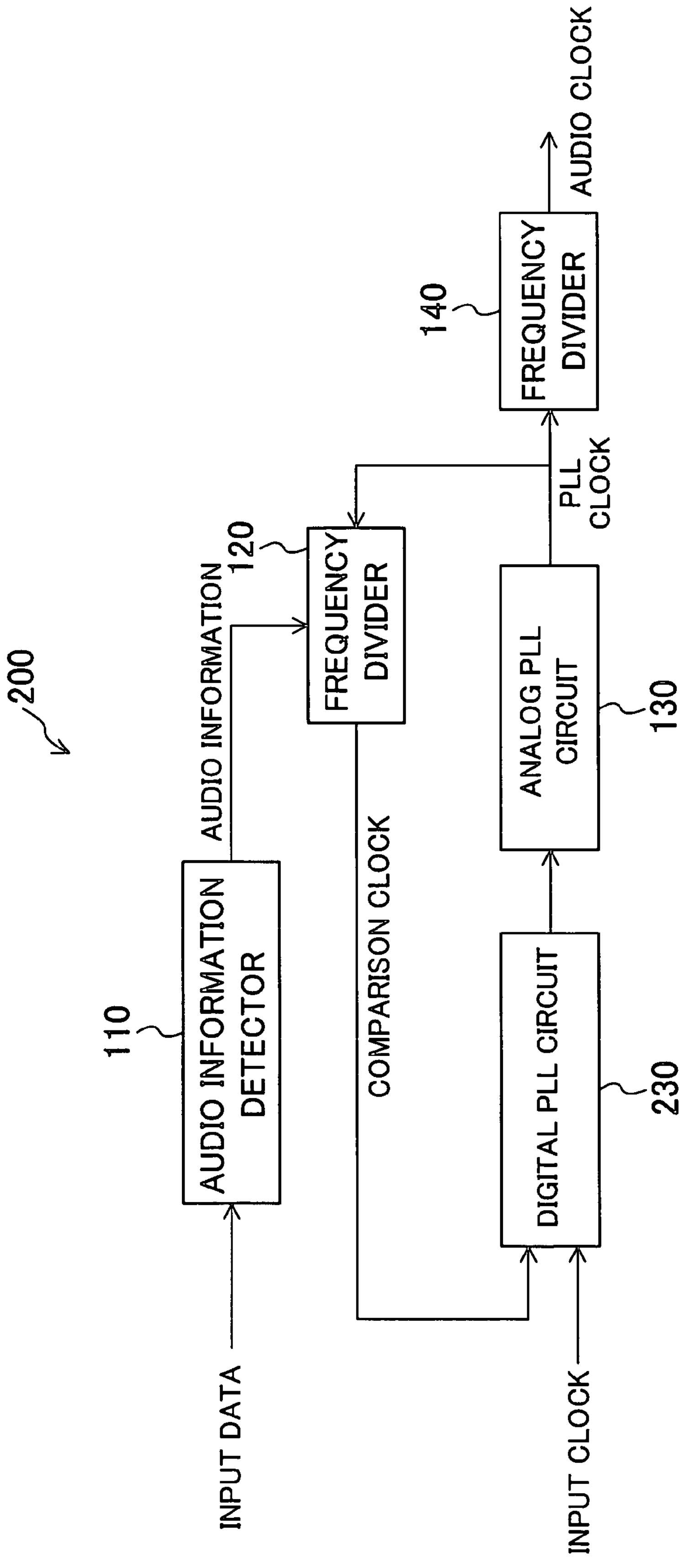
FIG. 2 is a block diagram illustrating a configuration of an audio processor according to a second embodiment of the present invention.

FIG. 2 is a block diagram illustrating a configuration of an audio processor 200 according to a second embodiment of the present invention. The audio processor 200 is different from the audio processor 100 of the first embodiment in that a digital PLL circuit 230 is additionally provided. In the following embodiments, each component with substantially the same function as in the first embodiment will be identified by the same reference numeral, and description thereof will be omitted.

The digital PLL circuit 230 outputs, to an analog PLL circuit 130, a clock signal (i.e., a pre-PLL clock signal) whose phase has been changed such that an input clock signal and a comparison clock signal are synchronized with each other.

The foregoing configuration enables reduction of the lock time for the PLL circuit, as compared to such a case where only the analog PLL circuit 130 is provided as in the audio processor 100 of the first embodiment.

Embodiment 3

Figure 3:
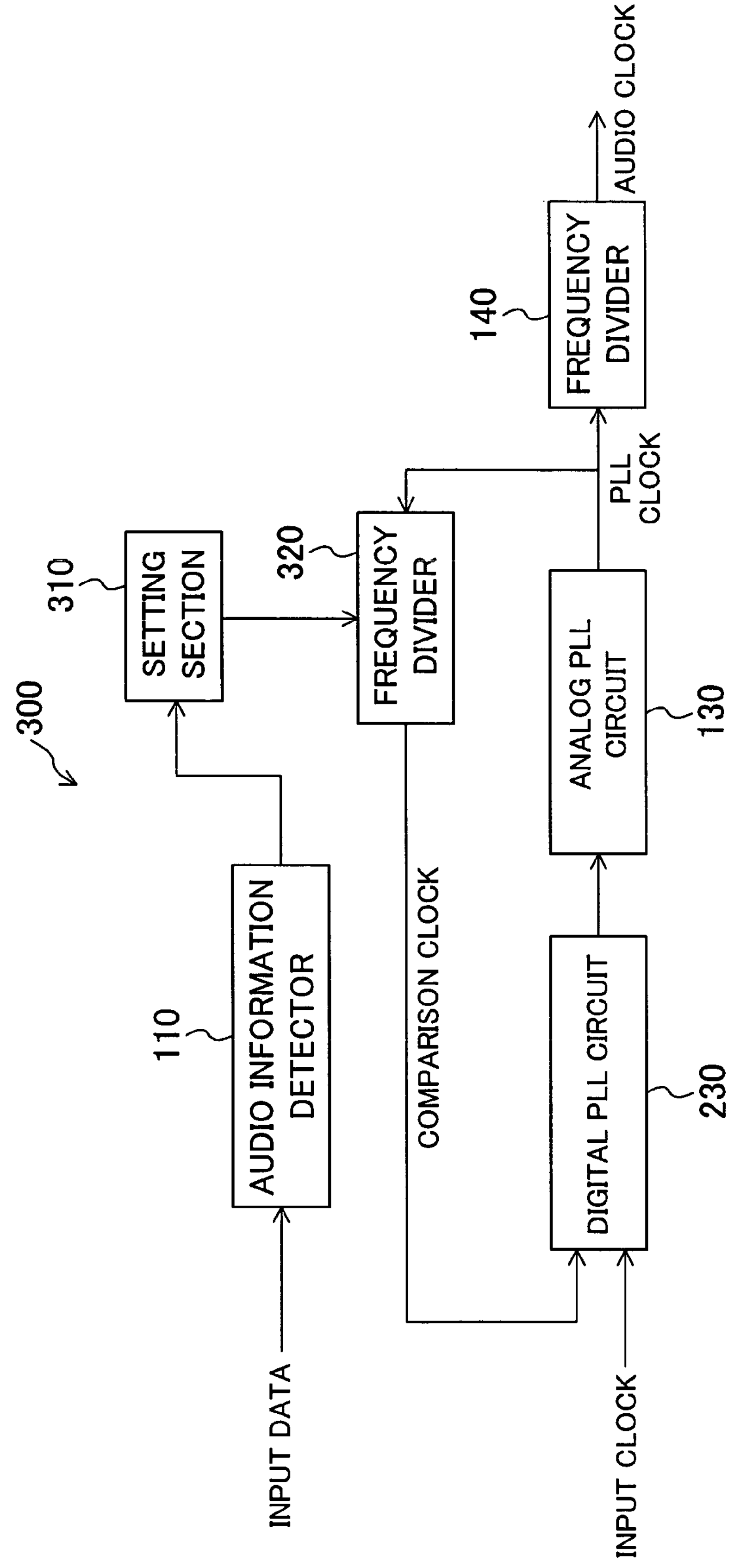
FIG. 3 is a block diagram illustrating a configuration of an audio processor according to a third embodiment of the present invention.

FIG. 3 is a block diagram illustrating a configuration of an audio processor 300 according to a third embodiment of the present invention. The audio processor 300 is different from the audio processor 200 in that a setting section 310 is additionally provided and the frequency divider 120 of the audio processor 200 is replaced by a frequency divider 320.

The setting section 310 determines a frequency division ratio based on audio information and sets the frequency division ratio in the frequency divider 320.

The frequency divider 320 performs frequency division on a PLL clock signal by the frequency division ratio set in the setting section 310 and outputs the determined frequency division ratio to a digital PLL circuit 230.

In this manner, the setting section 310 sets the frequency division ratio in the frequency divider 320, so that operation of, for example, the audio processor 300 is easily controlled using software.

Embodiment 4

Figure 4:
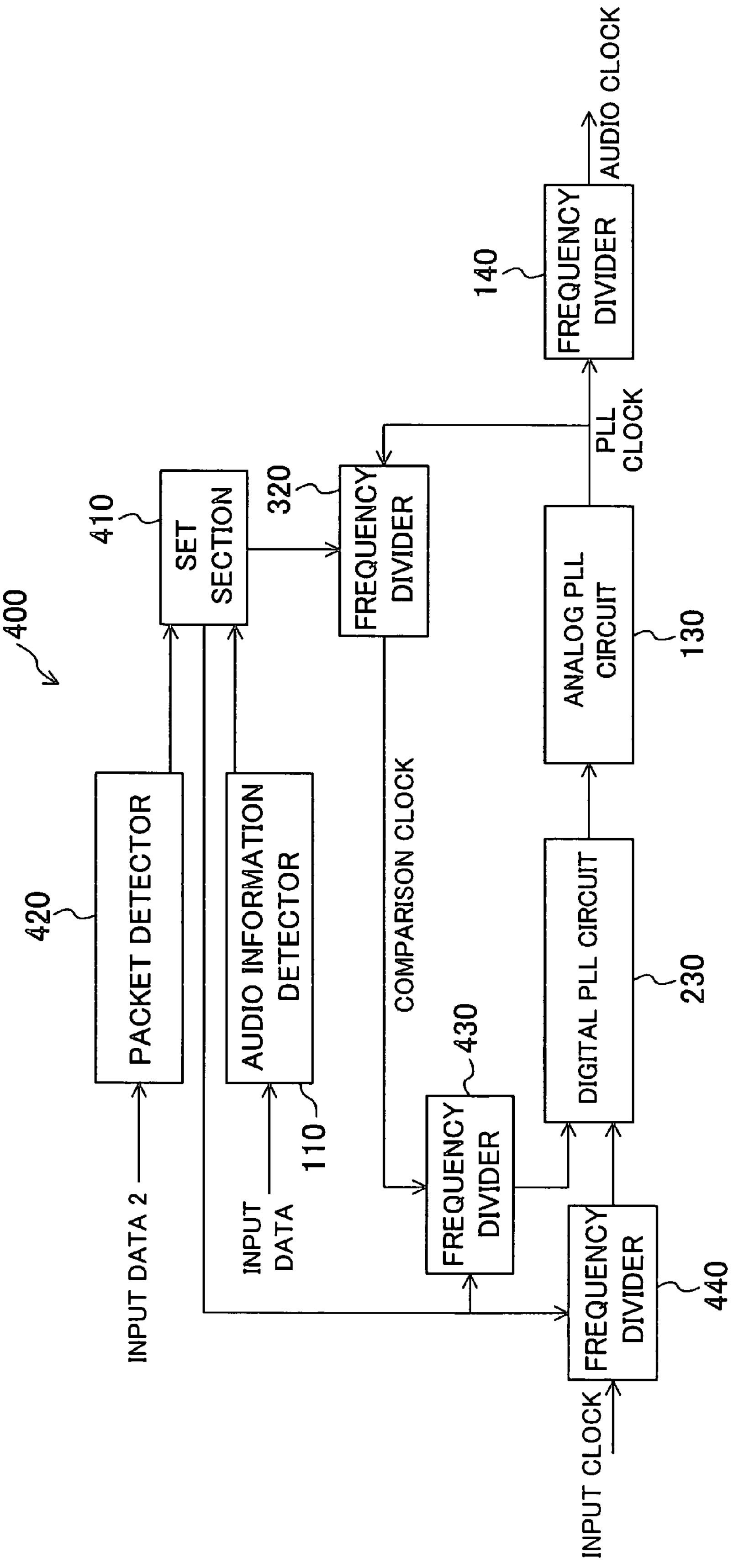
FIG. 4 is a block diagram illustrating a configuration of an audio processor according to a fourth embodiment of the present invention.

FIG. 4 is a block diagram illustrating a configuration of an audio processor 400 according to a fourth embodiment of the present invention. The audio processor 400 is different from the audio processor 300 in that a packet detector 420, a frequency divider 430 and a frequency divider 440 are additionally provided and the setting section 310 is replaced by a setting section 410.

The setting section 410 determines a frequency division ratio based on audio information and also determines frequency division ratios for the frequency dividers 430 and 440 using N information and CTS information included in a packet called clock regeneration packet (CRP) in the HDMI standard. Specifically, the frequency division ratio of the frequency divider 430 is set at N and the frequency division ratio of the frequency divider 440 is set at CTS.

The packet detector 420 receives the CRP (i.e., input data 2 shown in FIG. 4), extracts N information and CTS information included in the CRP and outputs the extracted information to the setting section 410.

The frequency divider 430 divides the frequency of a comparison clock signal by the frequency division ratio set by the setting section 410 to obtain a frequency of 1/N, and outputs the resultant signal to a digital PLL circuit 230.

The frequency divider 440 divides the frequency of an input clock signal by the frequency division ratio set by the setting section 410 to obtain a frequency of 1/CTS, and outputs the resultant signal to the digital PLL circuit 230.

With the foregoing configuration of the audio processor 400, an audio clock signal conforming to the HDMI standard is output.

Embodiment 5

Figure 5:
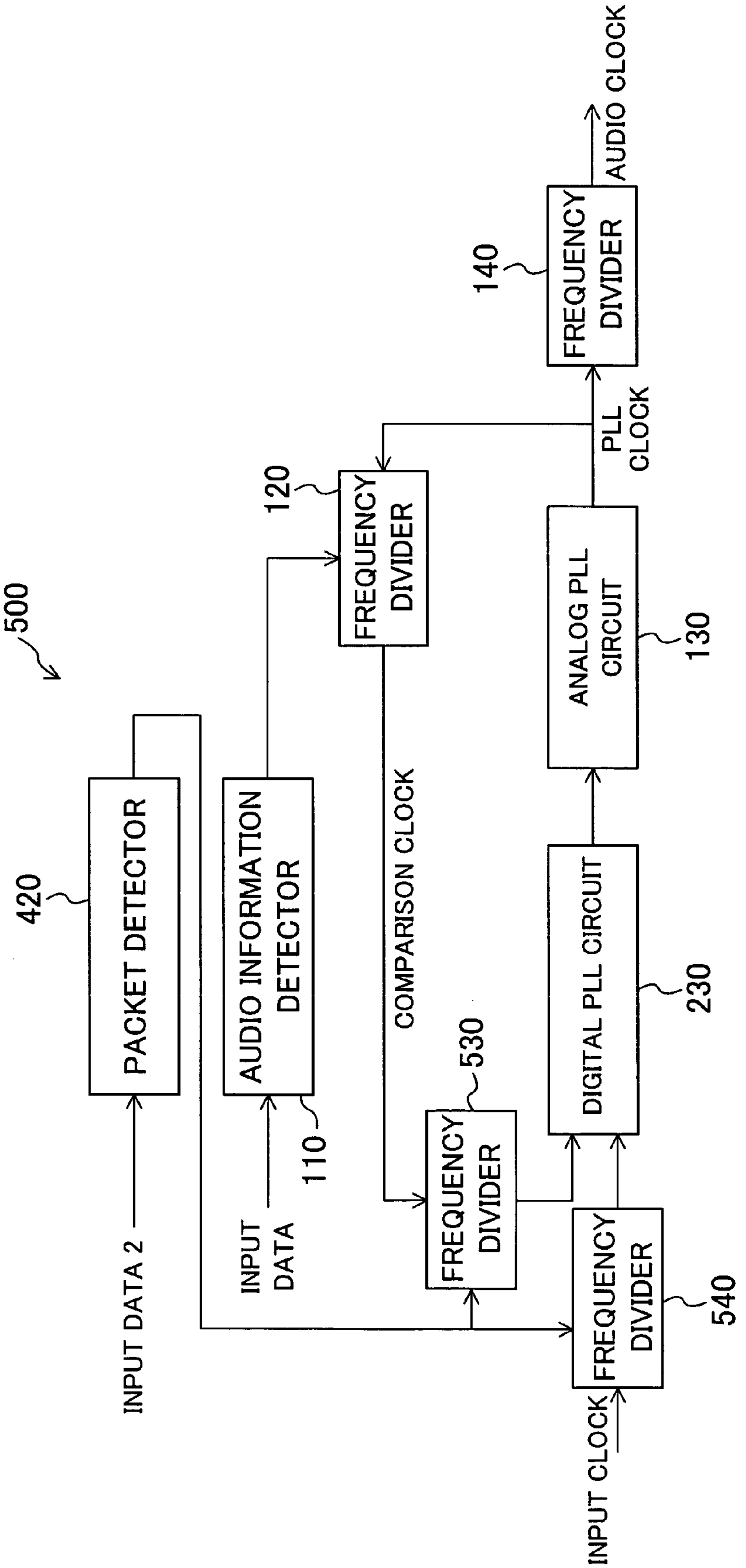
FIG. 5 is a block diagram illustrating a configuration of an audio processor according to a fifth embodiment of the present invention.

FIG. 5 is a block diagram illustrating a configuration of an audio processor 500 according to a fifth embodiment of the present invention. In the audio processor 500, the setting section 410 of the audio processor 400 of the fourth embodiment is omitted and the frequency dividers 430 and 440 are replaced by frequency dividers 530 and 540, respectively.

The frequency divider 530 divides the frequency of a comparison clock signal down to 1/N based on N information extracted by a packet detector 420 and outputs the resultant signal to a digital PLL circuit 230.

The frequency divider 540 divides the frequency of an input clock signal down to 1/CTS based on CTS information extracted by the packet detector 420 and outputs the resultant signal to the digital PLL circuit 230.

In this manner, the frequency division ratios are directly set in a frequency divider 120, for example, without the use of the setting section 410, so that the audio processor 500 has an advantage in which no redundant access time occurs.

Each of the digital PLL circuits 230 of the second through fifth embodiments may include a frequency division ratio table, for example, such that a frequency division ratio is selected from the frequency division ratio table based on the audio information and/or the CRP so as to change the frequency of the pre-PLL clock signal. This allows the PLL circuit to be locked at higher speed.

The frequency division ratio for generating a comparison clock signal may not be obtained by the frequency divider 120 or other components but may be obtained in such a manner that the audio information is transmitted to a component outside the audio processor and a frequency division ratio is obtained outside the processor, for example. In such a case, it is sufficient that a receiver for receiving the frequency division ratio transmitted from the outside is provided and the frequency division ratio received by the receiver is set in, for example, the frequency divider 120.

As described above, the audio processor according to the present invention has an advantage in which it is possible to generate various audio clock signals without increase in circuit scale and is effective as an audio processor or another device for use in reproducing audio data transmitted through a digital interface such as an IEEE 1394 interface or a high-definition multimedia interface (HDMI) for DVD players, digital television sets and AV amplifiers, for example.

What is claimed is:

1. An audio processor for reproducing audio data transmitted through a digital interface, comprising:

a sampling frequency information detector for detecting sampling frequency information indicating a sampling frequency of the audio data from the audio data;

a comparison clock frequency divider for obtaining a frequency division ratio according to the sampling frequency information, dividing a frequency of a PLL clock signal and outputting a comparison clock signal obtained by dividing the frequency of the PLL clock signal by the frequency division ratio;

a digital PLL circuit for outputting a pre-PLL clock signal having a phase according to a phase difference between an input reference clock signal and the comparison clock signal;

an analog PLL circuit for outputting the PLL clock signal based on the pre-PLL clock signal and outputting a resultant signal; and an audio clock frequency divider for dividing the frequency of the PLL clock signal and outputting an audio clock signal obtained by dividing the frequency of the PLL clock signal, wherein the digital PLL circuit is configured to change the frequency of the pre-PLL clock signal according to the sampling frequency information.

2. An audio processor for reproducing audio data transmitted through a digital interface, comprising:

a sampling frequency information detector for detecting sampling frequency information indicating a sampling frequency of the audio data from the audio data;

a comparison clock frequency divider for dividing a frequency of a PLL clock signal and outputting a comparison clock signal obtained by dividing the frequency of the PLL clock signal;

a frequency-division-ratio setting section for obtaining a frequency division ratio according to the sampling frequency information and setting the obtained frequency division ratio in the comparison clock frequency divider;

a digital PLL circuit for outputting a pre-PLL clock signal having a phase according to a phase difference between an input reference clock signal and the comparison clock signal;

an analog PLL circuit for outputting the PLL clock signal based on the pre-PLL clock signal; and an audio clock frequency divider for dividing the frequency of the PLL clock signal and outputting an audio clock signal obtained by dividing the frequency of the PLL clock signal, wherein the digital PLL circuit is configured to change the frequency of the pre-PLL clock signal according to the sampling frequency information.

3. An audio processor for reproducing audio data transmitted through a digital interface, comprising:

a sample rate information detector for detecting sample rate information indicating a sampling frequency of the audio data from the audio data;

a frequency ratio information detector for detecting, from the audio data, frequency ratio information indicating a ratio between a frequency of a transmission clock signal for use in transmission of the audio data and the sampling frequency;

a first comparison clock frequency divider for dividing a frequency of a PLL clock signal and outputting a first comparison clock signal obtained by dividing the frequency of the PLL clock signal;

a second comparison clock frequency divider for outputting a second comparison clock signal obtained by dividing the frequency of the first comparison clock signal;

a reference clock signal frequency divider for outputting a frequency division reference clock signal obtained by dividing the frequency of an input reference clock signal;

a frequency-division-ratio setting section for obtaining a frequency division ratio for the first comparison clock frequency divider according to the sample rate information, setting the obtained frequency division ratio in the first comparison clock frequency divider, obtaining a frequency division ratio for the second comparison clock frequency divider and a frequency division ratio for the reference clock signal frequency divider according to the frequency ratio information and setting the obtained frequency division ratios in the second comparison clock frequency divider and the reference clock signal frequency divider, respectively;

a digital PLL circuit for outputting a pre-PLL clock signal having a phase according to a phase difference between the frequency division reference clock signal and the second comparison clock signal;

an analog PLL circuit for outputting the PLL clock signal based on the pre-PLL clock signal; and an audio clock frequency divider for dividing the frequency of the PLL clock signal and outputting an audio clock signal obtained by dividing the frequency of the PLL clock signal, wherein the digital PLL circuit is configured to change the frequency of the pre-PLL clock signal according to the sampling frequency information.

4. An audio processor for reproducing audio data transmitted through a digital interface, comprising:

a sample rate information detector for detecting sample rate information indicating a sampling frequency of the audio data from the audio data;

a frequency ratio information detector for detecting, from the audio data, frequency ratio information indicating a ratio between the frequency of a transmission clock signal for use in transmission of the audio data and the sampling frequency;

a first comparison clock frequency divider for obtaining a frequency division ratio according to the sample rate information, dividing a frequency of a PLL clock signal and outputting a first comparison clock signal obtained by dividing the frequency of the PLL clock signal by the obtained frequency division ratio;

a second comparison clock frequency divider for obtaining a frequency division ratio according to the frequency ratio information and outputting a second comparison clock signal obtained by dividing the frequency of the first comparison clock signal by the obtained frequency division ratio;

a reference clock signal frequency divider for obtaining a frequency division ratio according to the frequency ratio information and outputting a frequency division reference clock signal obtained by dividing the frequency of an input reference clock signal by the obtained frequency division ratio;

a digital PLL circuit for outputting a pre-PLL clock signal having a phase according to a phase difference between the frequency division reference clock signal and the second comparison clock signal;

an analog PLL circuit for outputting the PLL clock signal based on the pre-PLL clock signal and outputting a resultant signal; and an audio clock frequency divider for dividing the frequency of the PLL clock signal and outputting an audio clock signal obtained by dividing the frequency of the PLL clock signal, wherein the digital PLL circuit is configured to change the frequency of the pre-PLL clock signal according to the sampling frequency information.

5. An audio processor for reproducing audio data transmitted through a digital interface, comprising:

a sampling frequency information detector for detecting sampling frequency information indicating a sampling frequency of the audio data from the audio data;

a comparison clock frequency divider for obtaining a frequency division ratio according to the sampling frequency information, dividing a frequency of a PLL clock signal and outputting a comparison clock signal obtained by dividing the frequency of the PLL clock signal by the frequency division ratio;

a digital PLL circuit for outputting a pre-PLL clock signal having a phase according to a phase difference between an input reference clock signal and the comparison clock signal;

an analog PLL circuit for outputting the PLL clock signal based on the pre-PLL clock signal and outputting a resultant signal; and an audio clock frequency divider for dividing the frequency of the PLL clock signal and outputting an audio clock signal obtained by dividing the frequency of the PLL clock signal, wherein the digital PLL circuit is configured to change the frequency of the pre-PLL clock signal according to the frequency ratio information.

6. An audio processor for reproducing audio data transmitted through a digital interface, comprising:

a sampling frequency information detector for detecting sampling frequency information indicating a sampling frequency of the audio data from the audio data;

a comparison clock frequency divider for dividing a frequency of a PLL clock signal and outputting a comparison clock signal obtained by dividing the frequency of the PLL clock signal;

a frequency-division-ratio setting section for obtaining a frequency division ratio according to the sampling frequency information and setting the obtained frequency division ratio in the comparison clock frequency divider;

a digital PLL circuit for outputting a pre-PLL clock signal having a phase according to a phase difference between an input reference clock signal and the comparison clock signal;

an analog PLL circuit for outputting the PLL clock signal based on the pre-PLL clock signal; and an audio clock frequency divider for dividing the frequency of the PLL clock signal and outputting an audio clock signal obtained by dividing the frequency of the PLL clock signal, wherein the digital PLL circuit is configured to change the frequency of the pre-PLL clock signal according to the frequency ratio information.

7. An audio processor for reproducing audio data transmitted through a digital interface, comprising:

a sample rate information detector for detecting sample rate information indicating a sampling frequency of the audio data from the audio data;

a frequency ratio information detector for detecting, from the audio data, frequency ratio information indicating a ratio between a frequency of a transmission clock signal for use in transmission of the audio data and the sampling frequency;

a first comparison clock frequency divider for dividing a frequency of a PLL clock signal and outputting a first comparison clock signal obtained by dividing the frequency of the PLL clock signal;

a second comparison clock frequency divider for outputting a second comparison clock signal obtained by dividing the frequency of the first comparison clock signal;

a reference clock signal frequency divider for outputting a frequency division reference clock signal obtained by dividing the frequency of an input reference clock signal;

a frequency-division-ratio setting section for obtaining a frequency division ratio for the first comparison clock frequency divider according to the sample rate information, setting the obtained frequency division ratio in the first comparison clock frequency divider, obtaining a frequency division ratio for the second comparison clock frequency divider and a frequency division ratio for the reference clock signal frequency divider according to the frequency ratio information and setting the obtained frequency division ratios in the second comparison clock frequency divider and the reference clock signal frequency divider, respectively;

a digital PLL circuit for outputting a pre-PLL clock signal having a phase according to a phase difference between the frequency division reference clock signal and the second comparison clock signal;

an analog PLL circuit for outputting the PLL clock signal based on the pre-PLL clock signal; and an audio clock frequency divider for dividing the frequency of the PLL clock signal and outputting an audio clock signal obtained by dividing the frequency of the PLL clock signal, wherein the digital PLL circuit is configured to change the frequency of the pre-PLL clock signal according to the frequency ratio information.

8. An audio processor for reproducing audio data transmitted through a digital interface, comprising:

a sample rate information detector for detecting sample rate information indicating a sampling frequency of the audio data from the audio data;

a frequency ratio information detector for detecting, from the audio data, frequency ratio information indicating a ratio between the frequency of a transmission clock signal for use in transmission of the audio data and the sampling frequency;

a first comparison clock frequency divider for obtaining a frequency division ratio according to the sample rate information, dividing a frequency of a PLL clock signal and outputting a first comparison clock signal obtained by dividing the frequency of the PLL clock signal by the obtained frequency division ratio;

a second comparison clock frequency divider for obtaining a frequency division ratio according to the frequency ratio information and outputting a second comparison clock signal obtained by dividing the frequency of the first comparison clock signal by the obtained frequency division ratio;

a reference clock signal frequency divider for obtaining a frequency division ratio according to the frequency ratio information and outputting a frequency division reference clock signal obtained by dividing the frequency of an input reference clock signal by the obtained frequency division ratio;

a digital PLL circuit for outputting a pre-PLL clock signal having a phase according to a phase difference between the frequency division reference clock signal and the second comparison clock signal;

an analog PLL circuit for outputting the PLL clock signal based on the pre-PLL clock signal and outputting a resultant signal; and an audio clock frequency divider for dividing the frequency of the PLL clock signal and outputting an audio clock signal obtained by dividing the frequency of the PLL clock signal, wherein the digital PLL circuit is configured to change the frequency of the pre-PLL clock signal according to the frequency ratio information.

* * * * *